United States Patent
Sullivan et al.

(10) Patent No.: US 11,304,289 B1
(45) Date of Patent: Apr. 12, 2022

(54) METHOD AND APPARATUS FOR NEAR-END CROSSTALK REDUCTION

(71) Applicant: DY 4 SYSTEMS, INC., Kanata (CA)

(72) Inventors: Robert C. Sullivan, Wareham, MA (US); Gerald W. Foster, Haverhill, MA (US); Ivan Straznicky, Carleton Place (CA)

(73) Assignee: DY4 SYSTEMS, INC., Kanata (CA)

( * ) Notice: Subject to any disclaimer, the term of this patent is extended or adjusted under 35 U.S.C. 154(b) by 71 days.

(21) Appl. No.: 16/993,764

(22) Filed: Aug. 14, 2020

Related U.S. Application Data

(60) Provisional application No. 62/887,710, filed on Aug. 16, 2019.

(51) Int. Cl.
| | |
|---|---|
| *H04B 3/32* | (2006.01) |
| *H05K 1/02* | (2006.01) |
| *H04B 1/04* | (2006.01) |
| *H01P 3/08* | (2006.01) |
| *H01P 5/08* | (2006.01) |

(52) U.S. Cl.
CPC ............ *H05K 1/0216* (2013.01); *H01P 3/08* (2013.01); *H01P 5/08* (2013.01); *H04B 1/0475* (2013.01); *H05K 1/0248* (2013.01)

(58) Field of Classification Search
CPC ......... H04B 3/32; H04B 1/0475; H04L 25/08; H05K 1/0216; H05K 1/0248; H01P 3/08; H01P 5/08; Y10S 439/941
See application file for complete search history.

(56) References Cited

U.S. PATENT DOCUMENTS

| | | | | |
|---|---|---|---|---|
| 5,181,198 A | * | 1/1993 | Lechleider | H04B 3/237 370/286 |
| 9,554,455 B2 | | 1/2017 | Aihara et al. | |
| 2007/0293094 A1 | * | 12/2007 | Aekins | H05K 1/0228 439/676 |
| 2019/0123781 A1 | * | 4/2019 | Linney | H04L 25/08 |

OTHER PUBLICATIONS

Aihara et al., "A novel method to reduce differential crosstalk in a high-speed channel", DesignCon 2015.

* cited by examiner

*Primary Examiner* — David S Huang
(74) *Attorney, Agent, or Firm* — Pearne & Gordon LLP

(57) ABSTRACT

A system for reducing near-end crosstalk (NEXT) includes a first electrical component contributing to a first NEXT pulse of a first polarity and a second electrical component receiving the first NEXT pulse at a first time delay (td). A circuit couples the first electrical component to the second electrical component to create a second NEXT pulse of a second polarity and delays the second NEXT pulse by an amount equal to the first time delay (td). The first and second NEXT pulses are combined to reduce the first NEXT pulse. A method for reducing NEXT includes coupling a first component contributing to a first NEXT pulse of a first polarity and a second component to create a second NEXT pulse of a second polarity, delaying the second NEXT pulse, and combining the second NEXT pulse with the first NEXT pulse to reduce the first NEXT pulse.

27 Claims, 7 Drawing Sheets

US 11,304,289 B1

METHOD AND APPARATUS FOR NEAR-END CROSSTALK REDUCTION

CROSS-REFERENCE TO RELATED APPLICATIONS

This application claims the benefit of U.S. Provisional Patent Application Ser. No. 62/887,710 entitled "METHOD AND APPARATUS FOR NEAR-END CROSSTALK REDUCTION" which was filed on Aug. 16, 2019. The entirety of the aforementioned application is herein incorporated by reference.

FIELD OF INVENTION

The following description relates generally to communications systems and, more particularly, to methods for reducing near-end crosstalk (NEXT) in electrical circuits or channels which transmit differential signals.

BACKGROUND OF INVENTION

Undesired coupling (e.g., crosstalk) between differential pairs of electrical signals is a phenomenon that occurs routinely when a transmitted signal creates an undesired effect in another circuit or channel of transmission. Crosstalk is usually caused by undesired capacitive, inductive, or conductive coupling from one circuit or channel to another. Crosstalk coupling can occur in many ways, including but not limited to, between traces, pads, vias, components, and inside components, such as connectors, for example. Crosstalk is a significant issue in cabling, audio electronics, integrated circuit design, and communication systems. Crosstalk coupling is commonly categorized as far-end crosstalk (FEXT), which applies to signals travelling in the same direction (e.g., transmission Tx to Tx, or receiving Rx to Rx), and near-end crosstalk (NEXT), which applies to signals travelling in opposite directions (e.g., Tx to Rx, or Rx to Tx).

Traditionally crosstalk, particularly smaller NEXT pulses, can be minimized by the use of shielding or spacing distance, or can be cancelled by the geometry of components in some cases. Known FEXT coupling can be reduced or cancelled by adding a simple cancelling coupler circuit in cascade. However, these approaches have not proven effective for NEXT cancelling, particularly for cancelling of larger NEXT pulses. It would be desirable to provide a reliable method of cancelling, or at least significantly reducing, larger NEXT pulses.

SUMMARY

The following presents a simplified summary of the invention in order to provide a basic understanding of some example aspects of the invention. This summary is not an extensive overview of the invention. Moreover, this summary is not intended to identify critical elements of the invention or to delineate the scope of the invention. The sole purpose of the summary is to present some concepts in a simplified form as a prelude to the more detailed description that is presented later.

In one general aspect, a system for reducing near-end crosstalk (NEXT) includes a first electrical component contributing to a first NEXT pulse of a first polarity, a second electrical component receiving the first NEXT pulse at a first time delay (td), a circuit configured to couple the first electrical component to the second electrical component to create a second NEXT pulse of a second polarity and to delay the second NEXT pulse by an amount equal to the first time delay (td), and a combiner configured to combine the second NEXT pulse with the first NEXT pulse to reduce the first NEXT pulse.

In the system according to the foregoing aspect, the pulse width (pw) of the first NEXT pulse is equal to the pulse width (pw) of the second NEXT pulse.

In the system according to the foregoing aspect, the combiner is configured to substantially reduce the first NEXT pulse.

In the system according to the foregoing aspect, the combiner is configured to cancel the first NEXT pulse.

In the system according to the foregoing aspect, the second NEXT pulse is delayed by the electrical length between the NEXT coupling region of the first electrical component and the coupling end of the second electrical component.

In the system according to the foregoing aspect, the circuit is configured to couple the first electrical component to the second electrical component by a single-ended coupler trace.

In the system according to the foregoing aspect, the single-ended coupler trace between the NEXT coupling region of the first electrical component and the coupling end of the second electrical component has an electrical length approximately equal to the first time delay (td) of the first NEXT pulse.

In the system according to the foregoing aspect, the amplitude of the second NEXT pulse is larger than the amplitude of the first NEXT pulse.

In the system according to the foregoing aspect, the combiner includes a resistor connected to a coupling end of the second electrical component. The resistor is configured to align the amplitude of the second NEXT pulse with the amplitude of the first NEXT pulse to cancel the first NEXT pulse or reduce the amplitude of the first NEXT pulse.

In the system according to the foregoing aspect, at least one of the first electrical component and the second electrical component is a printed circuit board including a backplane, a plug-in module, a mezzanine module, or a combination thereof.

In the system according to the foregoing aspect, the first NEXT pulse exists on the receiving side of the second electrical component.

In the system according to the foregoing aspect, each of the first electrical component and the second electrical component comprises a differential pair of electrical conductors.

In the system according to the foregoing aspect, the first electrical component and the second electrical component are coupled by at least one of a resistive coupling, an inductive coupling, a stripline coupler, a microstrip coupler, a via coupler, or a ring coupler.

In another general aspect, a method for reducing near-end crosstalk (NEXT) includes coupling a first component and a second component, the first component contributing to a first NEXT pulse of a first polarity at a first time delay (td), the coupling creating a second NEXT pulse of a second polarity. The method further includes delaying the second NEXT pulse by an amount equal to the first time delay (td), and combining the second NEXT pulse with the first NEXT pulse to reduce the first NEXT pulse.

In the method according to the foregoing aspect, the amplitude of the second NEXT pulse is larger than the amplitude of the first NEXT pulse.

In the method according to the foregoing aspect, the first NEXT pulse exists on the receiving side of the second component.

In the method according to the foregoing aspect, the width of the first NEXT pulse is equal to the width of the second NEXT pulse.

In the method according to the foregoing aspect, the first component and the second component are coupled by a single-ended coupler trace.

In the method according to the foregoing aspect, the single-ended coupler trace between the NEXT coupling region of the first component and the coupling end of the second component has an electrical length approximately equal to the first time delay (td) of the first NEXT pulse.

The method according to the foregoing aspect further includes reducing at least one further NEXT pulse contributed by other electrical components.

In the method according to the foregoing aspect, the at least one further NEXT pulse exists on the receiving side of the first component.

In the method according to the foregoing aspect, the at least one further NEXT pulse has a different amplitude than the amplitude of the second NEXT pulse.

In the method according to the foregoing aspect, the at least one further NEXT pulse has a different pulse width than the pulse width of the second NEXT pulse.

In the method according to the foregoing aspect, the at least one further NEXT pulse is delayed by an amount different from the first time delay (td).

The method according to the foregoing aspect further includes reducing a plurality of NEXT pulses contributed by the same component.

The method according to the foregoing aspect further includes reducing a plurality of NEXT pulses contributed by different components.

In another general aspect, a method for reducing near-end crosstalk (NEXT) includes splitting off a portion of a transmission signal through a first component, the first component contributing to a first NEXT pulse of a first polarity at a first time delay (td). The method further includes coupling the first component and a second component, the coupling creating a second NEXT pulse of a second polarity. The method also includes delaying the second NEXT pulse by an amount equal to the first time delay (td) and combining the second NEXT pulse with the first NEXT pulse to reduce the first NEXT pulse.

BRIEF DESCRIPTION OF THE DRAWINGS

The foregoing and other aspects of the present disclosure will become apparent to those skilled in the art to which the present disclosure relates upon reading the following description with reference to the accompanying drawings, in which.

Figure 1:
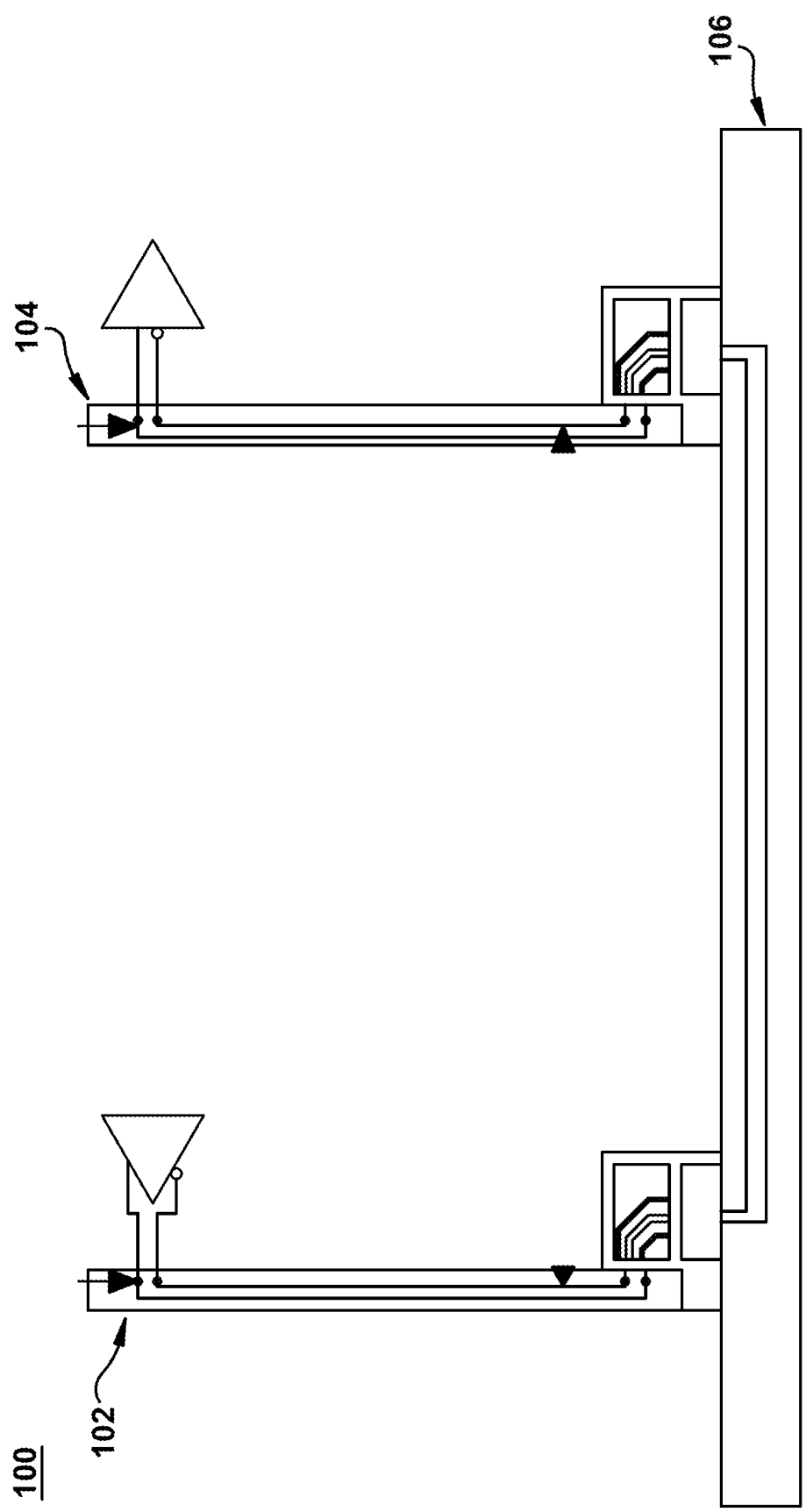
FIG. 1 is a schematic diagram of a system with two plug-in modules and a backplane, according to an exemplary application.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Examples will now be described more fully hereinafter with reference to the accompanying drawings in which example embodiments are shown. However, aspects may be embodied in many different forms and should not be construed as limited to the embodiments set forth herein. Moreover, certain terminology is used herein for convenience only and is not to be taken as a limitation. For example, the use of the term "NEXT cancellation" does not necessarily mean a complete cancelling or elimination of NEXT coupling, but may also be intended to mean a reduction or a substantial reduction of NEXT coupling, depending on the specific implementation.

Elements of a signal path through a printed circuit board (PCB) can include, but are not limited to, device packages, connectors, conductive traces, vias, such as signal vias and reference vias (e.g., power vias, ground vias, etc.), and conductive elements. Any of these elements can compromise the signal integrity. As signals are exchanged at a multilayer circuit board, for example, undesirable signal integrity issues can arise between differential pairs and at the vias. One of these issues relates to noise and undesired electromagnetic coupling induced by densely-packed neighboring connections, for example. The undesired electromagnetic coupling is commonly referred to as crosstalk.

The method described herein achieves reduction of a known-amplitude undesired NEXT coupling between an aggressor differential pair and a victim differential pair that are routed through one or more components which have undesired NEXT coupling. The aggressor differential pair and the victim differential pair can be connectors, vias, and/or traces in a printed circuit board. Specifically, the method described herein reduces NEXT on the receiving side of a component or a group of components. However, embodiments are not limited thereto and the described method may be applied on the transmitting side of a component or a group of components, as well as in other applications with NEXT issues.

As described above, traditional methods for crosstalk cancelling have not proven efficient in all situations. In particular, larger NEXT pulses and/or NEXT pulses caused by (attributed to) the connector and/or the breakout region (BOR) of a printed circuit board (PCB) where the traces are broken out to attach the connector terminals to the PCB can be particularly problematic.

The method described herein achieves NEXT reduction by using a simple coupler circuit in cascade to intentionally create NEXT cancellation pulses in conjunction with a time delay to align the intentionally created NEXT cancellation pulses with the NEXT pulses to be cancelled. Specifically, in one embodiment, the method uses trace coupling to couple cancelling NEXT pulses with NEXT pulses (to be reduced or cancelled) from an aggressor signal, traces to create a time delay between the two NEXT pulses, and resistors to combine the two NEXT pulses with an aligned amplitude on the receiving side of the victim signal, such that the resulting cumulative NEXT pulse is substantially reduced or cancelled. However, embodiments are not limited thereto and other coupling methods may be utilized. For example, other methods may use different coupler types, such as microstrip couplers, via couplers, or ring couplers, for example and different joiner types, as well as a splitter to split off a small portion of the transmission (Tx) signal with a time delay and a coupler to couple back into the receiving (Rx) signal.

FIG. 1 is a schematic diagram of a system 100 that includes two modules 102 and 104 and a backplane 106, according to an exemplary application of the method described herein. The modules 102 and 104 may be plug-in modules which are configured to connect to the backplane 106, for example, via slots (not shown in FIG. 1) designed to receive the modules 102 and 104.

Figure 2:
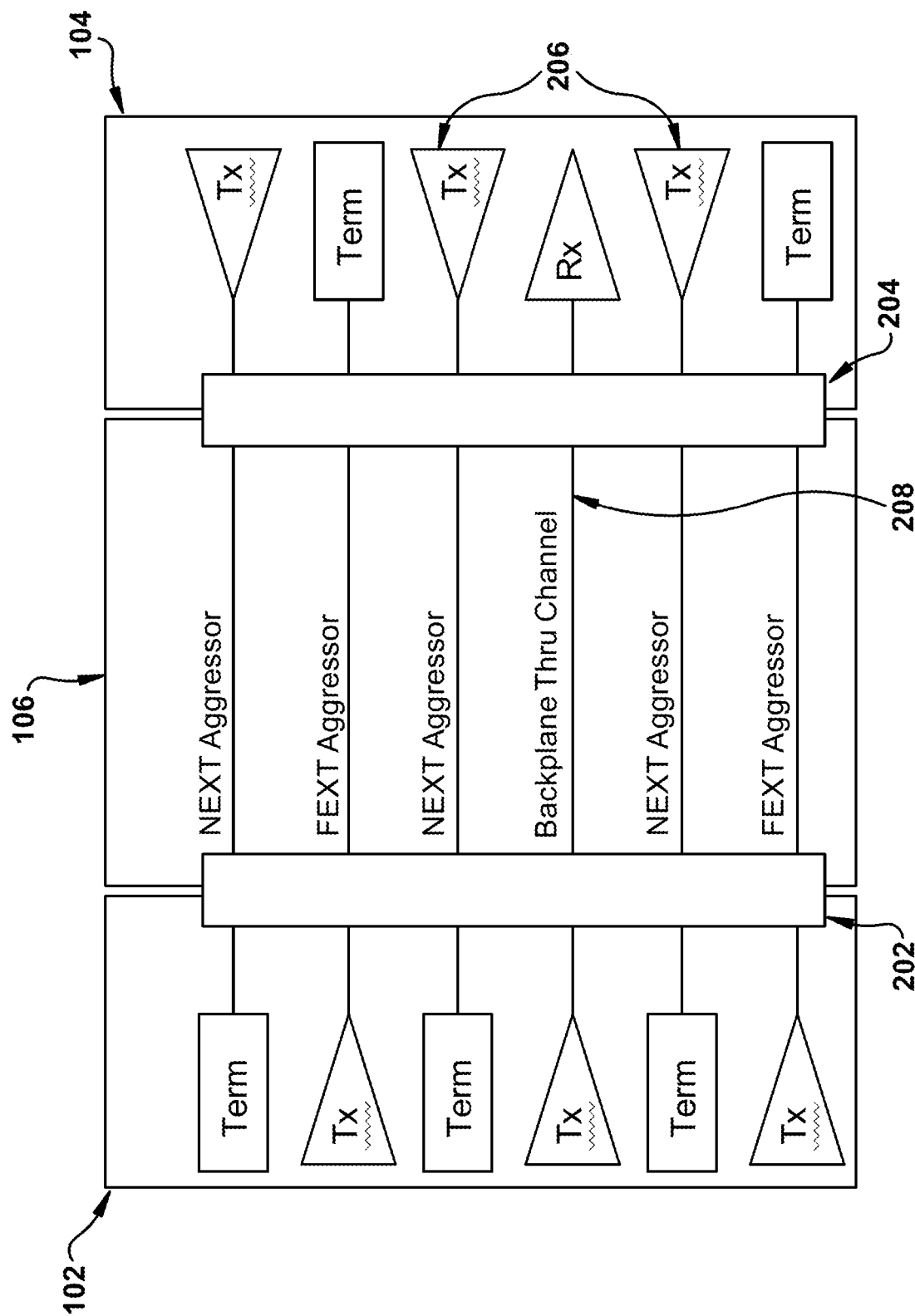
FIG. 2 is a schematic diagram of connectors connecting the components of the system of FIG. 1.

In an embodiment of the invention schematically illustrated in FIG. 2, the backplane 106 and the modules 102 and 104 can have a set of interlocking connectors 202 and 204 designed to interlock with each other when the modules 102 and 104 are placed in the slots of the backplane 106. The interlocking connectors 202 and 204 can be compatible with any of a plurality of switched fabric network standards, such as the ANSI/VITA 46.0-2007 standard for VPX systems, for example. Differential signaling protocols can be InfiniBand, Serial RapidIO, FibreChannel, Ethernet, PCI Express, and the like, for example.

In the example illustrated in FIGS. 1 and 2, the module 102 is a transmitting module and the module 104 is a receiving module. However, embodiments are not limited thereto and other configurations using a mezzanine module (e.g., an XMC switched mezzanine card, FMC mezzanine card, etc.), a mezzanine carrier configured to accept printed circuit board assemblies, including VPX cards, etc., and/or other module known to those of ordinary skill in the art, may be contemplated.

The modules 102 and 104 and the backplane 106 can each be implemented as, or can include, a printed circuit board (PCB) that can be, but is not limited to, a multi-layer PCB, for example. At least one layer of the PCB can have multiple conductive paths for transferring electrical signals between elements in the circuit board and/or external components. Further conductive traces (not shown) can be arranged at various locations at or between different layers of the circuit board. The circuit board can include via stubs, such as controlled via stubs by back-drilling, sequential lamination, blind or buried vias, for example, as well as other electronic circuit board components known to those of ordinary skill in the art, which are not shown or described herein for brevity.

FIG. 2 illustrates accumulation of NEXT by a thru-victim communication channel, in accordance with the embodiment illustrated in FIG. 1. A differential pair 206 can serve as an active channel, or an aggressor in this example. A victim through channel 208 (corresponding to the differential pair 208 later shown in FIGS. 3 and 4) may be affected by NEXT from the aggressor differential pairs 206. The aggressor differential pairs 206 and the victim differential pair 208 may be routed through one or more components, such as a connector, vias, and/or traces in a printed circuit board. However, embodiments are not limited thereto and other types of components, such as a semiconductor chip package, for example, may be contemplated.

Figure 3:
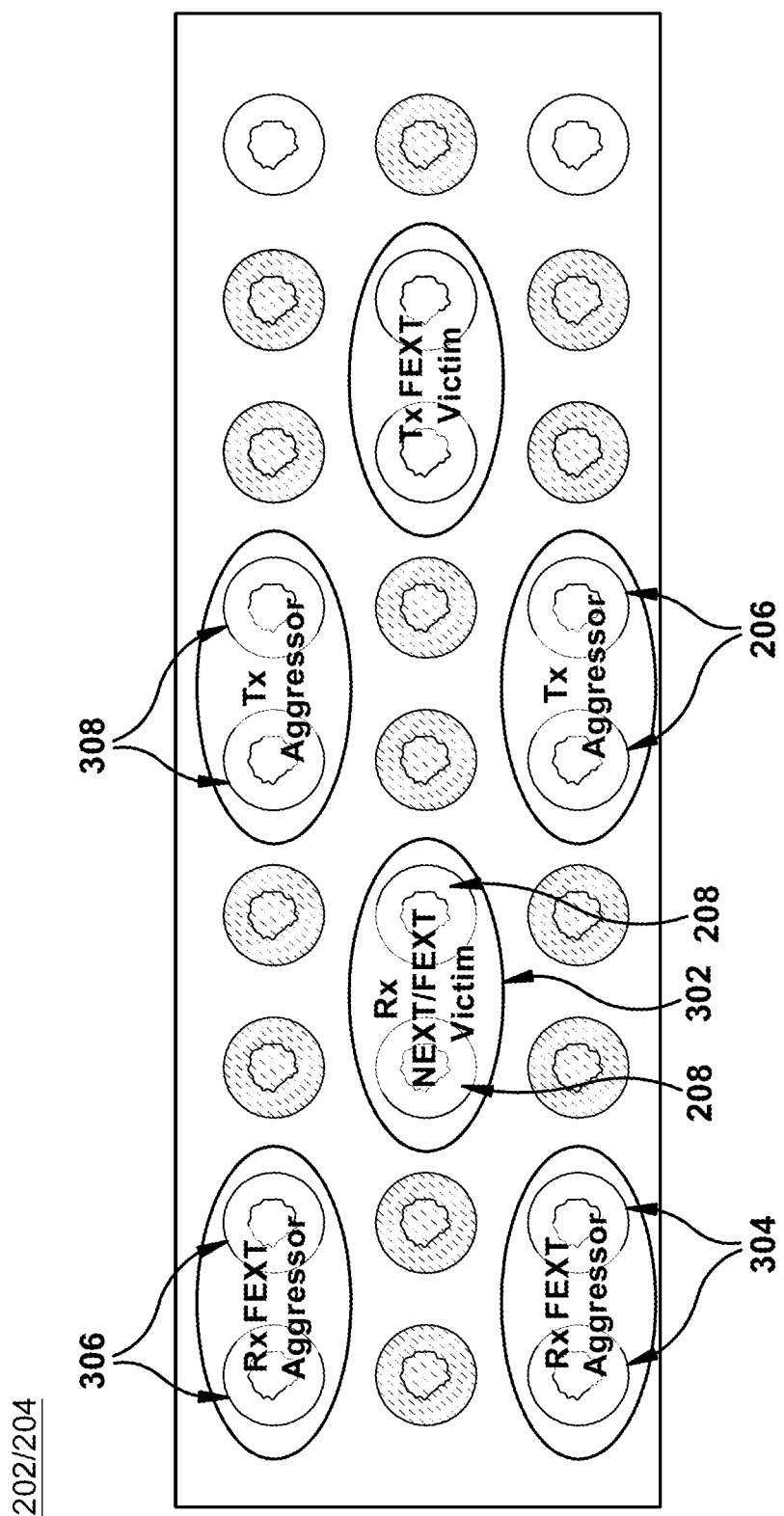
FIG. 3 is a top view of the connector pin layout of the system of FIG. 1.

FIG. 3 shows the pin layouts for one of the connectors 202 or 204 illustrated in FIG. 2. The receiving side 302 of the victim differential pair 208 may be affected by NEXT from the aggressor differential pair 206, as well as NEXT or FEXT from other aggressor differential pairs 304, 306, and 308, for example. Specifically, when electrical signal propagates through the aggressor differential pair 206, undesired NEXT coupling can be detected at the victim differential pair 208. It is particularly desirable to perform NEXT reduction on the receiving side 302 of the victim differential pair 208.

Figure 4:
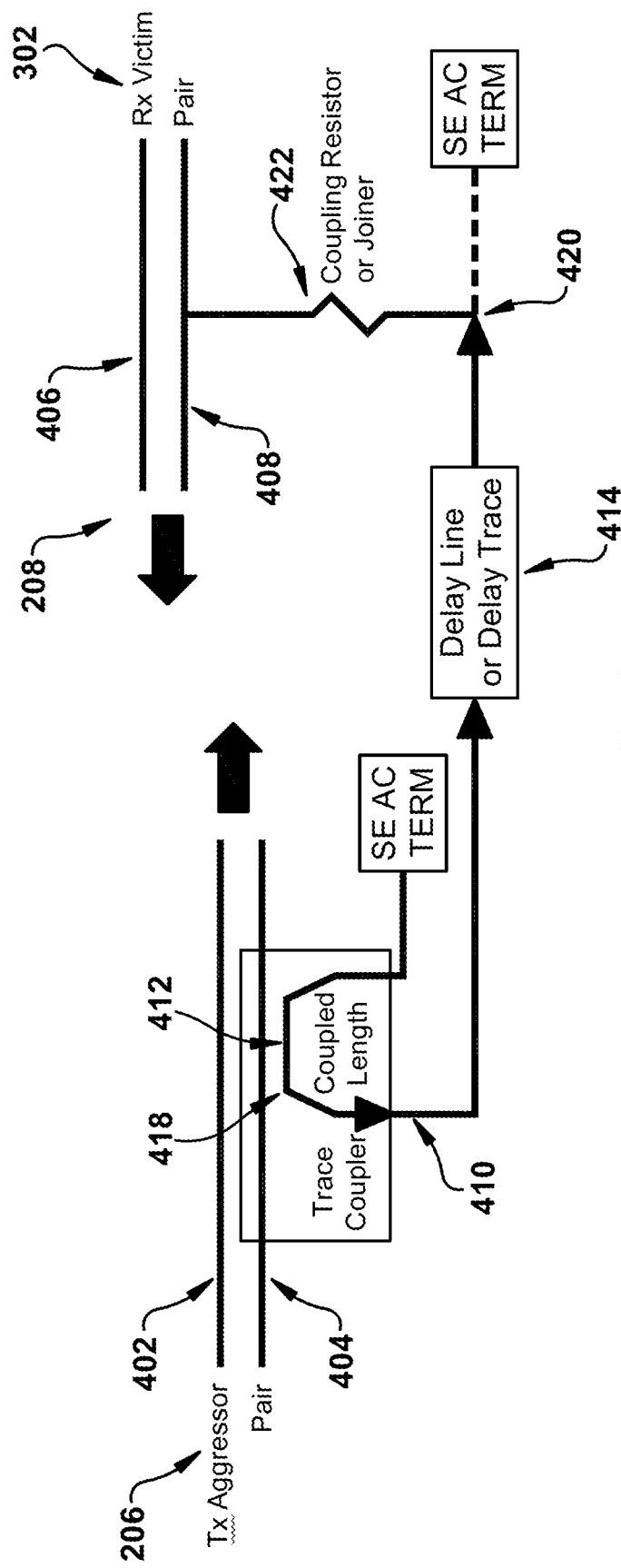
FIG. 4 is a schematic diagram of NEXT reduction, according to an embodiment.

FIG. 4 is a schematic diagram illustrating a structure and method of NEXT reduction on the receiving side 302 of the victim differential pair 208 (shown in FIGS. 2 and 3), according to an embodiment. As shown in FIG. 4, traces 402 and 404 can form a first differential trace pair 206. The differential pair 206 can serve as an active channel, or an aggressor, in this example. Traces 406 and 408 can form a second differential trace pair 208. The differential pair 208 can serve as a victim channel, in this example.

One of the traces 402 or 404 on the transmission (Tx) end of the aggressor differential pair 206 can be coupled to a single ended coupler trace 410 using a tuned stripline coupler (or other coupler) with a coupled length that is tuned for the desired NEXT pulse width. The coupler trace then is delayed using precise delay line or trace length line 414 (creating a time delay) that matches up the NEXT cancellation pulse timing before being joined using a resistor (or other type of joiner) into one of the traces 406 or 408 on the receiving (Rx) side of the victim differential pair 208. The coupling, through the single-ended coupler trace 410, and the time delay 414, between the transmission (Tx) end of the aggressor differential pair 206 and the receiving (Rx) side of the victim differential pair 208 can produce a second NEXT pulse of an opposite polarity with the same pulse width (pw) and time delay as the pulse width (pw) and time delay of the NEXT pulse of the aggressor differential pair 206, but with a larger amplitude than the amplitude of the NEXT pulse of the aggressor differential pair 206. As a result of the cascaded coupling between the transmission (Tx) end of the aggressor differential pair 206 and the receiving (Rx) side of the victim differential pair 208, through the single-ended coupler trace 410, the effects of the two NEXT pulses are accumulated and the resulting combined NEXT pulse may be reduced substantially due to the opposite polarity of the two NEXT pulses. The term "substantial reduction" in this context means reducing the combined NEXT pulse to a low enough level at which the performance of the system is within acceptable operational parameters despite the presence of the combined NEXT pulse.

The opposite polarity of the NEXT pulse of the aggressor differential pair 206 and the second NEXT pulse can be accomplished by either coupling the far end 420 of the single-ended coupler trace 410 with an inverse polarity on the same side of the victim differential pair 208, or by coupling the far coupling end 420 of the single-ended coupler trace 410 with the same polarity on an opposite side of the victim differential pair 208.

The embodiment illustrated in FIG. 4 uses a single-ended stripline coupler trace 410. However, embodiments are not limited thereto and other types of couplers, such as microstrip couplers, via couplers or ring couplers, for example, may be implemented.

The single-ended coupler trace 410 can have a coupled length 412 that may be designed to match the pulse width (pw) of the NEXT pulse of the aggressor differential pair 206. The pulse width (pw) and amplitude of the NEXT pulse of the aggressor differential pair 206 can be determined with simulation models of the connectors 202 and 204, and their associated vias, for example. Simulation models that may be used can include S-parameter models or SPICE models, for example. The time domain coupling can be simulated by using a step input. Alternatively, the time domain coupling can be measured by using a step input.

When a transmission (Tx) aggressor signal from a module, such as module 102 (shown in FIG. 1), for example, passes through an offending component and/or vias, it creates one or more NEXT pulses on the receiving (Rx) victim side 302. The timing of the pulses on the receiving (Rx) victim side 302 entering the receiving module 104 depends on the electrical distances of the coupling inside the component and/or vias. In other words, the receiving (Rx) victim side 302 of the receiving module 104 receives the NEXT pulse(s) from the transmission (Tx) aggressor side of the module 102 at a time delay (td). In the case where two boards (e.g., backplane and module) are connected, the NEXT pulse(s) can only be corrected in a straightforward way on the module side (where the Tx NEXT Aggressor Serializer/Deserializer SerDes is located) with a time delay because there is no access to the delayed version of the transmission (Tx) on the other board without looping back through a connector. In the case where the offending component and/or vias are on one board, it may be impractical to create the second NEXT pulse at a precise timing. When the transmission (Tx) aggressor signal from the module passes through the offending component/vias, there may be one or more coupling regions where the Tx aggressor signal creates a NEXT pulse on the receiving (Rx) victim side. From the transmission (Tx) input on the module, there is a time delay (td) to reach the coupling region, and a roughly equal time delay (td) for the coupled pulse on the receiving (Rx) victim side to return back out to the receiving (Rx) output on the module. An example would be the NEXT coupling regions at the module vias and backplane vias with 1-inch long ideal connector transmission lines (i.e., with no NEXT) in the middle. This configuration can yield receiving (Rx) victim NEXT pulse with near zero time delay due to the module vias and a NEXT pulse with approximately 320 ps time delay (2×1-inch at 160 ps/inch) due to the backplane vias. Accordingly, the embodiment illustrated in FIG. 4 uses the time delay 414 to align the NEXT pulse of the aggressor differential pair 206 with the second NEXT pulse. Since the NEXT pulse of the aggressor differential pair 206 and the second NEXT pulse of the aggressor differential pair 206 have opposite polarities, the two aligned NEXT pulses can result in a substantial reduction of the NEXT pulse of the aggressor differential pair 206.

The time delay 414 can be implemented by roughly extending, the single-ended coupler trace 410 from the beginning 418 of the coupling region (e.g., the coupled length) 412 of the single-ended coupler trace 410 on the transmission (Tx) end of the aggressor differential pair 206 to the far coupling end 420 on the receiving (Rx) side of the victim differential pair 208 and its associated via. As a result, the second NEXT pulse can be delayed in the time domain by the electrical length between the coupling end 418 and the far coupling end 420. If the locations of the differential pair coupling ends 418 and 422 are not at the same electrical distance from the NEXT coupling region, then the delay will need to be adjusted slightly to compensate.

In simulations for a specific application, a coupling length of the single-ended coupler trace 410 of 400 mil and a coupling trace length (creating the time delay) 414 of 300 picoseconds have proven effective to substantially cancel the larger NEXT pulses caused by the connector and/or the breakout region (BOR) of a printed circuit board (PCB).

In some cases an aggressor signal may cause more than one NEXT pulse at different time delays and amplitudes, and these pulses may also be canceled in the same way, as can NEXT pulses from additional aggressors.

Once delayed, the second NEXT pulse can then be combined with the NEXT pulse of the aggressor differential pair 206 by connecting the far coupling end 420 of the single-ended coupler trace 410 to the receiving (Rx) side of the victim differential pair 208 and its associated via with a resistor 422. Because the amplitude of the second NEXT pulse is larger than the amplitude of the NEXT pulse of the aggressor differential pair 206, the resistor 422 can align (i.e., match) the amplitude of the delayed second NEXT pulse with the amplitude of the NEXT pulse of the aggressor differential pair 206 to achieve the desired cancellation pulse amplitude.

The embodiment illustrated in FIG. 4 uses the resistor 422 to achieve the desired cancellation pulse amplitude. However, embodiments are not limited thereto and other configurations may be contemplated. For example, some implementations may use more than one resistor for impedance matching.

In further embodiments, instead of the resistor 422, an inductive coupling with one or more turns of a circular trace around the via on the receiving side 302 of the victim differential pair 208 may be utilized to achieve the desired cancellation pulse amplitude. When the inductive coupling uses more than one turn, micro-vias along with stack-up changes may be required to allow use of a layer under the connector for the single-ended coupler trace and the micro-vias.

Other types of combiners, such as transformers or combiners with impedance matching may also be utilized.

Figure 5:
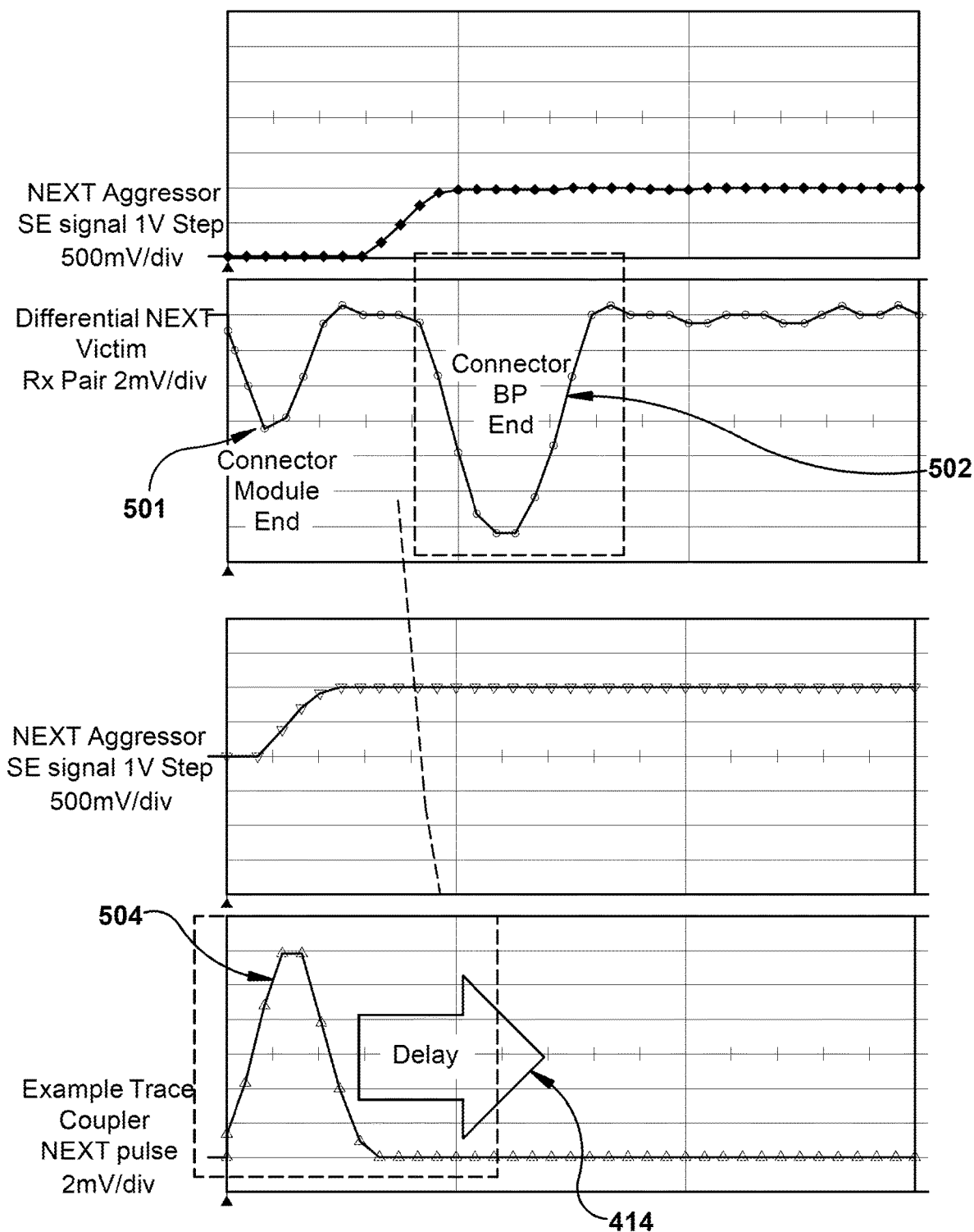
FIG. 5 illustrates example graphs of differential NEXT pulses in the time domain, according to the embodiment of FIG. 4.
Figure 6:
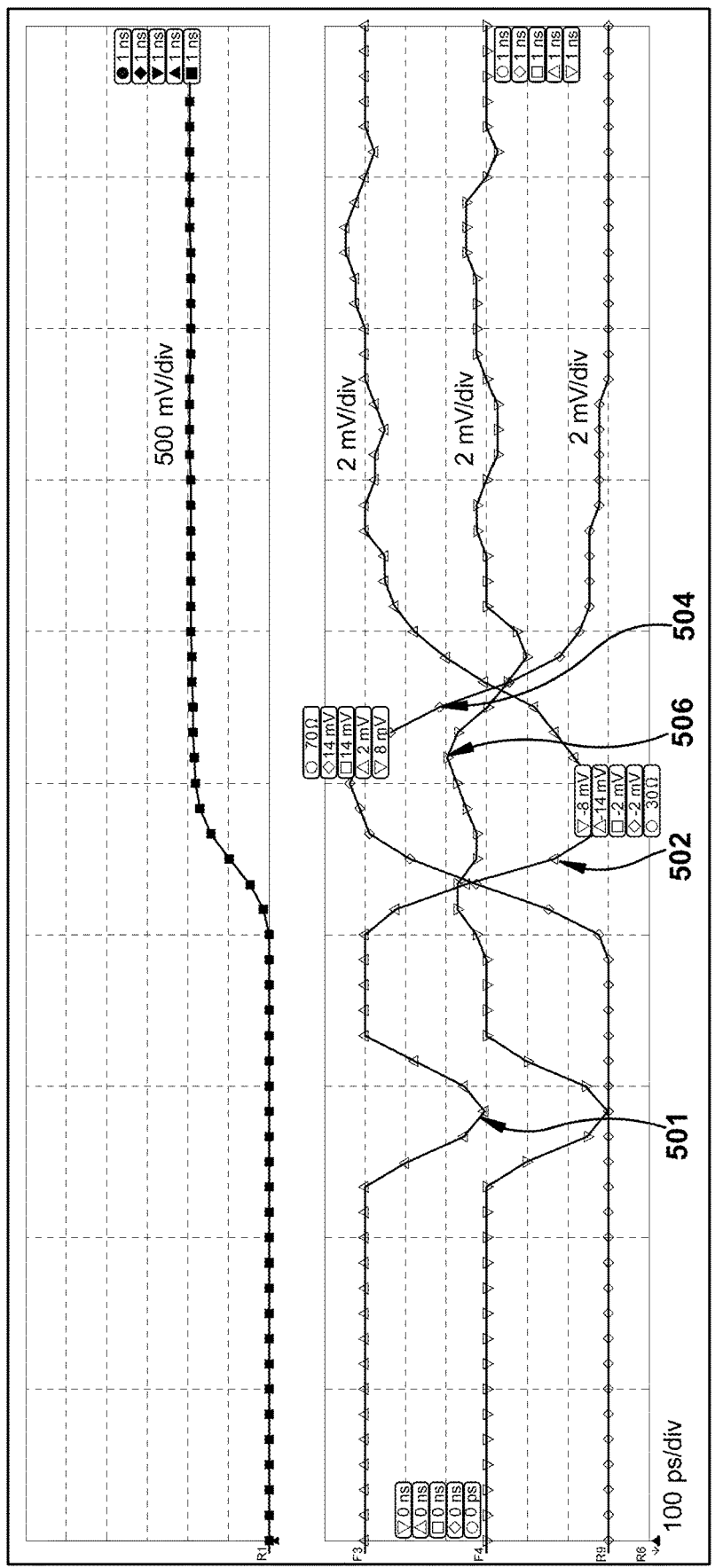
FIG. 6 illustrates example graphs of differential NEXT reduction in the time domain, according to the embodiment of FIG. 4.

FIG. 5 illustrates example simulation graphs of differential NEXT reduction in the time domain, according to the NEXT reduction method described above. Without limiting the present disclosure, the time-domain NEXT crosstalk illustrated in FIG. 5 was simulated with a step input of 1V and 50 ps rise time applied to each input port (e.g., RT3 connector module end, RT3 connector backplane end, etc.). The pulse labeled 502 is a NEXT pulse from the transmission (Tx) end of the aggressor differential pair 206. In the example of FIG. 5, the aggressor differential pair 206 (FIG. 4) is on the RT3 connector module end. The pulse labeled 504 is the second NEXT cancellation pulse generated by coupling the transmission (Tx) end of the aggressor differential pair 206 to the receiving (Rx) side 302 of the victim differential pair 208 (see FIG. 4). As shown in FIG. 5, the pulses 502 and 504 have substantially similar durations (i.e., widths), but opposite polarities. As described above, the pulse 504 is time-delayed with the time delay 414 (shown in, and described with reference to, FIG. 4) to line up with the pulse 502 (e.g., to align the pulses 502 and 504 in the time-domain). As a result, as further illustrated in FIG. 6, the pulse 502 and the time-delayed pulse 504 have substantially similar durations (i.e., widths), but opposite polarities. Further, using the resistor 422 (as illustrated in and as described with reference to FIG. 4), the amplitude of the pulse 504 can be aligned (i.e., matched) with the amplitude of the pulse 502 to achieve the desired cancellation pulse amplitude. The pulse 502 and the time-delayed and amplitude-aligned pulse 504 are then combined on the receiving (Rx) side 302 of the victim differential pair 208 to produce a pulse labeled 506, which is the result of the time-domain NEXT crosstalk reduction described above. As illustrated in FIG. 6, the amplitude of the pulse labeled 506 is significantly lower than the amplitude of the pulses 502 and 504, which results in reduction of the differential NEXT pulse induced on the receiving (Rx) side 302 of the victim differential pair 208.

The pulses 502 and 504 have opposite polarities, and as a result, reduction of the NEXT pulse from the transmission (Tx) end of the aggressor differential pair 206 takes place after the pulse 502 and the time-delayed and amplitude-aligned pulse 504 are combined.

The pulse labeled 501 (in FIGS. 5 and 6) is a second NEXT pulse which in this case for example is near the receiving (Rx) end of the aggressor differential pair 206. The pulse labeled 501 can be canceled in the same way, but in this case for example with a shorter delay than the delay required to cancel the pulse 502. Cancelling the pulse labeled 501 in this case for example will also require shorter pulse width and lower amplitude than pulse 502. However, other (e.g., further or previous) NEXT pulses may be cancelled with higher amplitude, wider pulse width, and/or longer delay, for example. In other words, other NEXT pulses may be cancelled with different amplitude, pulse width, and/or delay than the amplitude, pulse width, and/or delay required for cancelling the pulse 502. More than two NEXT pulses caused by the same aggressor could be canceled, if required; this can be readily accomplished by cascading two or more couplers with appropriate coupler amplitudes and widths, and with appropriate delays between the couplers on the single-ended coupler trace 410.

NEXT pulses caused by other aggressors, such as NEXT pulses caused by the aggressor differential pair 308 illustrated in FIG. 3 can also be canceled in the same way as NEXT pulses caused by the aggressor differential pair 206 are canceled, for example. NEXT pulses from more than two aggressors could be canceled, if required.

The NEXT reduction method described above with reference to FIGS. 4-6 uses a single-ended coupler trace 410 (stripline coupler) to couple one of the traces on the transmission (Tx) end of the aggressor differential pair 206 to the receiving (Rx) side 302 of the victim differential pair 208. However, embodiments are not limited thereto and other implementations of the NEXT method are possible. For example, one single-ended coupler trace may be coupled to the positive (+) receiving (Rx) victim signal and a second single-ended coupler trace may be coupled to the negative (−) receiving (Rx) victim signal. To achieve the correct polarity of the second NEXT pulse, the second single-ended coupler trace would need to be coupled to the negative (−) transmission (Tx) aggressor signal rather than to the positive (+) transmission (Tx) aggressor signal.

The disclosed method for NEXT reduction may be implemented on the backplane or on the module sides. However, the disclosed method for NEXT reduction is most effective on the transmission (Tx) module side where the largest NEXT coupling typically occurs.

Based on the preliminary signal integrity simulation results, the NEXT reduction method described herein may provide a substantial reduction of NEXT crosstalk in connectors and their associated vias. This substantial reduction of the NEXT crosstalk may double the speed of the connectors and may allow them to operate at speeds of 50 Gbaud (50 GBASE-KR or 200GBASE-KR4), which was previously not possible with the VPX connector system.

The NEXT reduction method described herein may also be used to reduce NEXT coupling inside other connectors, including but not limited to XMC mezzanine, FMC mezzanine, or MIL type rugged connectors, such as 38999, for example, which may otherwise not be changed due to standardization or customer requirements.

The NEXT reduction method described herein may be used to reduce NEXT on other boards or NEXT inside other types of components.

The NEXT reduction method described herein may be applied to a connector, a printed circuit board (PCB), a semiconductor chip package, or any differential system that experiences unwanted NEXT coupling.

Figure 7:
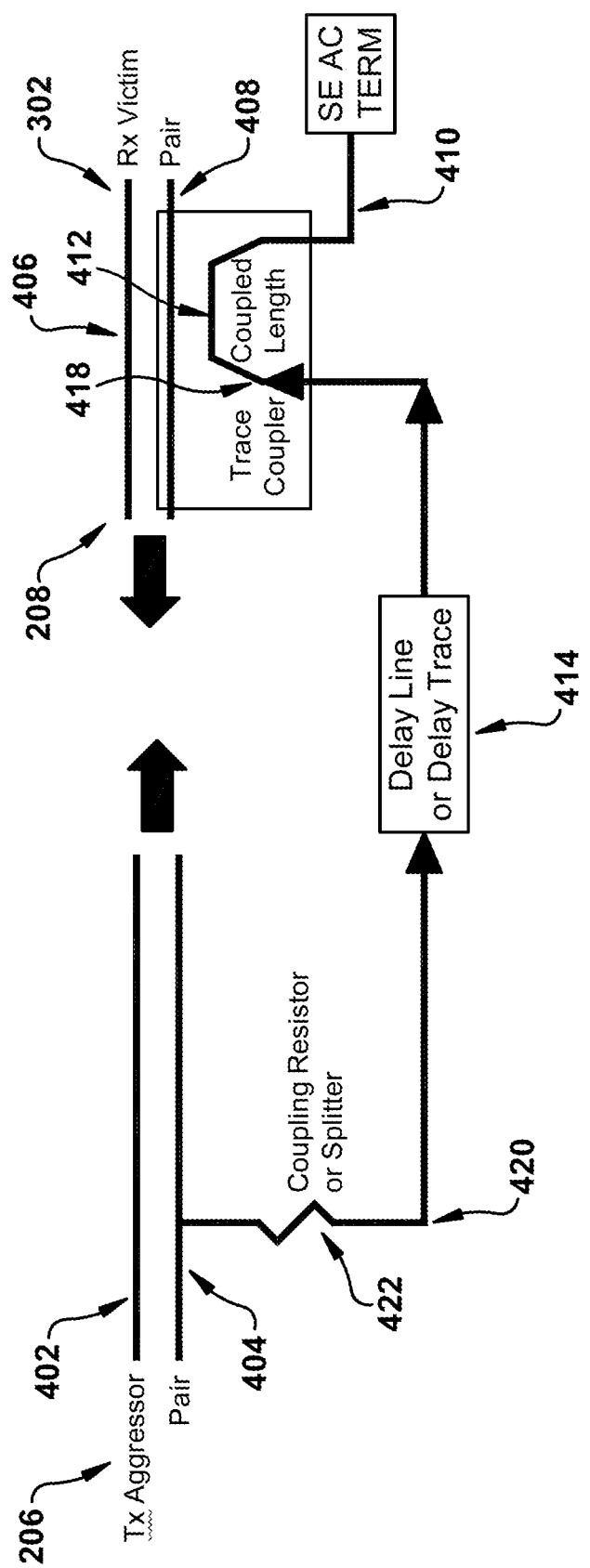
FIG. 7 is a schematic diagram of NEXT reduction, according to another embodiment.

It is also contemplated that the NEXT reduction method described herein may be modified as illustrated in FIG. 7, for example, to utilize a splitter, such as the resistor 422, for example, to split off a portion of the transmission (Tx) aggressor signal and a stripline coupler trace 410 to couple one of the traces 402 or 404 on the transmission (Tx) end of the aggressor differential pair 206 into one of the traces 406 or 408 on the receiving (Rx) side of the victim differential pair 208. Similar to the embodiment illustrated in, and described with reference to, FIG. 4, the coupling through the single-ended coupler trace 410 and the time delay 414 between the transmission (Tx) end of the aggressor differential pair 206 and the receiving (Rx) side of the victim differential pair 208 can produce a second NEXT pulse of an opposite polarity with the same pulse width (pw) and time delay (td) as the pulse width (pw) and time delay (td) of the NEXT pulse of the aggressor differential pair 206, but with a larger amplitude than the amplitude of the NEXT pulse of the aggressor differential pair 206. In other words, the embodiment illustrated in FIG. 7 utilizes first a splitter and after the time delay 414, a coupler trace 410 (e.g., coupler last) rather than a coupler trace 410 first (e.g., coupler first), as shown in FIG. 4, and after the time delay 414, the resistor (or other type of splitter) 422 to align (i.e., match) the amplitude of the time-delayed second NEXT pulse with the amplitude of the NEXT pulse of the aggressor differential pair 206 to achieve the desired cancellation pulse amplitude.

Other applications with NEXT issues, as will be understood by those skilled in the art, may also be possible. For example, although NEXT crosstalk is often considered in the frequency domain, NEXT pulse amplitude reduction or cancellation in the time domain can result in a reduction of NEXT crosstalk in the frequency domain.

Many other example embodiments can be provided through various combinations of the above described features. Although the embodiments described hereinabove use specific examples and alternatives, it will be understood by those skilled in the art that various additional alternatives may be used and equivalents may be substituted for elements and/or steps described herein, without necessarily deviating from the intended scope of the application. Modifications may be desirable to adapt the embodiments to a particular situation or to particular needs without departing from the intended scope of the application. It is intended that the application not be limited to the particular example implementations and example embodiments described herein, but that the claims be given their broadest reasonable interpretation to cover all novel and non-obvious embodiments, literal or equivalent, disclosed or not, covered thereby.

What is claimed is:

1. A system for reducing near-end crosstalk (NEXT), the system comprising:
   a first electrical component contributing to a first NEXT pulse of a first polarity;
   a second electrical component receiving the first NEXT pulse at a first time delay (td);
   a circuit configured to couple the first electrical component to the second electrical component to create a second NEXT pulse of a second polarity and to delay the second NEXT pulse by an amount equal to the first time delay (td); and a combiner configured to combine the second NEXT pulse with the first NEXT pulse to reduce the first NEXT pulse.

2. The system according to claim 1, wherein a pulse width (pw) of the first NEXT pulse is equal to a pulse width (pw) of the second NEXT pulse.

3. The system according to claim 1, wherein the combiner is configured to substantially reduce the first NEXT pulse.

4. The system according to claim 1, wherein the combiner is configured to cancel the first NEXT pulse.

5. The system according to claim 1, wherein the second NEXT pulse is delayed by an electrical length between a NEXT coupling region of the first electrical component and a coupling end of the second electrical component.

6. The system according to claim 5, wherein the circuit is configured to couple the first electrical component to the second electrical component by a single-ended coupler trace.

7. The system according to claim 6, wherein the single-ended coupler trace between the NEXT coupling region of the first electrical component and the coupling end of the second electrical component has an electrical length approximately equal to the first time delay (td) of the first NEXT pulse.

8. The system according to claim 1, wherein an amplitude of the second NEXT pulse is larger than an amplitude of the first NEXT pulse.

9. The system according to claim 8, wherein the combiner comprises a resistor connected to a coupling end of the second electrical component, wherein the resistor is configured to align the amplitude of the second NEXT pulse with the amplitude of the first NEXT pulse to cancel the first NEXT pulse or reduce the amplitude of the first NEXT pulse.

10. The system according to claim 1, wherein at least one of the first electrical component and the second electrical component is a printed circuit board including a backplane, a plug-in module, a mezzanine module, or a combination thereof.

11. The system according to claim 1, wherein the first NEXT pulse exists on a receiving side of the second electrical component.

12. The system according to claim 1, wherein each of the first electrical component and the second electrical component comprises a differential pair of electrical conductors.

13. The system according to claim 1, wherein the first electrical component and the second electrical component are coupled by at least one of a resistive coupling, an inductive coupling, a stripline coupler, a microstrip coupler, a via coupler, or a ring coupler.

14. A method for reducing near-end crosstalk (NEXT), the method comprising:
   coupling a first component and a second component, the first component contributing to a first NEXT pulse of a first polarity at a first time delay (td), said coupling creating a second NEXT pulse of a second polarity;
   delaying the second NEXT pulse by an amount equal to the first time delay (td); and
   combining the second NEXT pulse with the first NEXT pulse to reduce the first NEXT pulse.

15. The method according to claim 14, wherein an amplitude of the second NEXT pulse is larger than an amplitude of the first NEXT pulse.

16. The method according to claim 14, wherein the first NEXT pulse exists on a receiving side of the second component.

17. The method according to claim 14, wherein a width of the first NEXT pulse is equal to a width of the second NEXT pulse.

18. The method according to claim 17, wherein the first component and the second component are coupled by a single-ended coupler trace.

19. The method according to claim 18, wherein the single-ended coupler trace between a NEXT coupling region of the first component and a coupling end of the second component has an electrical length approximately equal to the first time delay (td) of the first NEXT pulse.

20. The method according to claim 14, further comprising:
   reducing at least one further NEXT pulse contributed by other electrical components.

21. The method according to claim 20, wherein the at least one further NEXT pulse exists on a receiving side of the first component.

22. The method according to claim 21, wherein the at least one further NEXT pulse has a different amplitude than an amplitude of the second NEXT pulse.

23. The method according to claim 21, wherein the at least one further NEXT pulse has a different pulse width than a pulse width of the second NEXT pulse.

24. The method according to claim 21, wherein the at least one further NEXT pulse is delayed by an amount different from the first time delay (td).

25. The method according to claim 14, further comprising:
   reducing a plurality of NEXT pulses contributed by a same component.

26. The method according to claim 14, further comprising:
   reducing a plurality of NEXT pulses contributed by different components.

27. A method for reducing near-end crosstalk (NEXT), the method comprising:
   splitting off a portion of a transmission signal through a first component, the first component contributing to a first NEXT pulse of a first polarity at a first time delay (td);
   coupling the first component and a second component, said coupling creating a second NEXT pulse of a second polarity;
   delaying the second NEXT pulse by an amount equal to the first time delay (td); and
   combining the second NEXT pulse with the first NEXT pulse to reduce the first NEXT pulse.

* * * * *